US012660123B2

(12) United States Patent
Schumm et al.

(10) Patent No.: US 12,660,123 B2
(45) Date of Patent: Jun. 16, 2026

(54) HEAT EXCHANGE ASSEMBLY AND THERMAL MANAGEMENT SYSTEM INCLUDING THE SAME

(71) Applicant: BorgWarner Inc., Auburn Hills, MI (US)

(72) Inventors: Sven Schumm, Walheim (DE); Iago Gonzalez Tabares, Vigo (ES); David Lago López, Vigo (ES); Jose Alberto Blanco Fernandez, Nigran (ES); Stephen Michael Bohan, Davisburg, MI (US)

(73) Assignee: BORGWARNER INC., Auburn Hills, MI (US)

( * ) Notice: Subject to any disclaimer, the term of this patent is extended or adjusted under 35 U.S.C. 154(b) by 192 days.

(21) Appl. No.: 18/405,073

(22) Filed: Jan. 5, 2024

(65) Prior Publication Data

US 2025/0227878 A1      Jul. 10, 2025

(51) Int. Cl.
*H05K 7/20*          (2006.01)
(52) U.S. Cl.
CPC ..... *H05K 7/20272* (2013.01); *H05K 7/20263* (2013.01)
(58) Field of Classification Search
CPC ...................... H05K 7/20272; H05K 7/20263
USPC ........................................................ 361/699
See application file for complete search history.

(56) References Cited

U.S. PATENT DOCUMENTS

| | | |
|---|---|---|
| 8,358,000 B2 | 1/2013 | Beaupre et al. |
| 11,292,085 B2 | 4/2022 | Kabelitz et al. |

| | | | | |
|---|---|---|---|---|
| 2017/0096066 A1* | 4/2017 | Lee | ......................... | B60L 50/61 |
| 2019/0154346 A1* | 5/2019 | Crawford | .............. | F28D 9/0093 |
| 2020/0398634 A1* | 12/2020 | Cheadle | ................. | F24H 1/121 |
| 2021/0325126 A1* | 10/2021 | Gao | ........................ | F28F 27/00 |

FOREIGN PATENT DOCUMENTS

| | | |
|---|---|---|
| EP | 3215310 B1 | 9/2019 |
| KR | 102426767 B1 | 7/2022 |

OTHER PUBLICATIONS

English language abstract for EP 3 215 310 B1 extracted from espacenet.com database on Jan. 8, 2024, 2 pages.
English language abstract and machine-assisted English translation for KR 102426767 B1 extracted from espacenet.com database on Jan. 8, 2024, 13 pages.

* cited by examiner

*Primary Examiner* — Zhengfu J Feng
(74) *Attorney, Agent, or Firm* — Howard & Howard Attorneys PLLC

(57)          ABSTRACT

A heat exchange assembly is configured to be coupled to a cooling loop for cooling an electronic component of a vehicle. The heat exchange assembly includes a heat exchange plate and a resistive heating element. The heat exchange plate includes a base plate configured to be in thermal communication with the electronic component, and a shell coupled to the base plate such that a cooling chamber is defined between the shell and the base plate. The shell is configured to provide a cooling fluid from the cooling loop to the cooling chamber and return the cooling fluid to the cooling loop. The resistive heating element is disposed on the shell and in thermal communication with the cooling chamber for heating the cooling fluid within the cooling chamber to increase the temperature of the cooling fluid returned to the cooling loop.

20 Claims, 18 Drawing Sheets

HEAT EXCHANGE ASSEMBLY AND THERMAL MANAGEMENT SYSTEM INCLUDING THE SAME

TECHNICAL FIELD

The present disclosure relates generally to thermal management systems and, more specifically, to heat exchange assemblies for such thermal management systems.

BACKGROUND

Electric vehicles (EVs) rely on thermal management systems to ensure optimal performance and longevity. Key components of EVs, such as the vehicle battery, power electronic components, electric motor, and vehicle cabin, each have optimal operating temperatures that require a thermal management system to add or remove heat as needed for each component to achieve these optimal operating temperatures. Current thermal management systems for EVs face challenges such as high costs, space constraints, and excessive complexity due to numerous components. Thus, a thermal management system designed to overcome one or more of the aforementioned challenges is desired.

SUMMARY AND ADVANTAGES

One general aspect of the present disclosure is directed to a heat exchange assembly configured to be coupled to a cooling loop of a vehicle for cooling an electronic component of the vehicle. The heat exchange assembly includes a heat exchange plate. The heat exchange plate includes a base plate and a shell. The base plate includes a first surface configured to be in thermal communication with the electronic component, and a second surface opposite the first surface. The shell is coupled to the second surface of the base plate. The shell includes an inner shell surface facing the second surface of the base plate such that a cooling chamber is defined between the inner shell surface and the second surface of the base plate, and an outer shell surface opposite the inner shell surface. The shell defines a fluid inlet and a fluid outlet. The fluid inlet is in fluid communication with the cooling chamber and configured to be in fluid communication with the cooling loop of the vehicle for providing a cooling fluid to the cooling chamber. The fluid outlet is in fluid communication with the cooling chamber and configured to be in fluid communication with the cooling loop of the vehicle for returning the cooling fluid to the cooling loop. The heat exchange assembly also includes a resistive heating element disposed on the outer shell surface and in thermal communication with the cooling chamber for heating the cooling fluid within the cooling chamber to increase the temperature of the cooling fluid returned to the cooling loop via the fluid outlet.

Another general aspect of the present disclosure is directed to a thermal management system. The thermal management system includes an electronic component. The thermal management system also includes a cooling loop for circulating a cooling fluid. The cooling loop includes a first outlet port for providing a cooling fluid and a first return port for receiving the cooling fluid. The thermal management system further includes a heat exchange plate. The heat exchange plate includes a base plate and a shell. The base plate includes a first surface arranged in thermal communication with the electronic component, and a second surface opposite the first surface. The shell is coupled to the second surface of the base plate. The shell includes an inner shell surface facing the second surface of the base plate such that a cooling chamber is defined between the inner shell surface and the second surface of the base plate, and an outer shell surface opposite the inner shell surface. The shell defines a fluid inlet and a fluid outlet. The fluid inlet is in fluid communication with the cooling chamber and the first outlet port of the cooling loop for providing the cooling fluid to the cooling chamber. The fluid outlet is in fluid communication with the cooling chamber and the first return port of the cooling loop for returning the cooling fluid to the cooling loop. The thermal management system also further includes a resistive heating element disposed on the outer shell surface and in thermal communication with the cooling chamber for heating the cooling fluid within the cooling chamber to increase the temperature of the cooling fluid returned to the cooling loop.

The heat exchange assembly and thermal management system including the same of the present disclosure have the advantage of eliminating the need for coupling a separate heating module to the cooling loop downstream of the heat exchange plate. Instead, a resistive heating element is disposed on the heat exchange plate itself, thus reducing the number of components in the thermal management system, reducing cost, and improving packaging within the vehicle.

BRIEF DESCRIPTION OF THE DRAWINGS

Advantages of the present disclosure will be readily appreciated as the same becomes better understood by reference to the following detailed description when considered in connection with the accompanying drawings.

DETAILED DESCRIPTION

Figure 1:
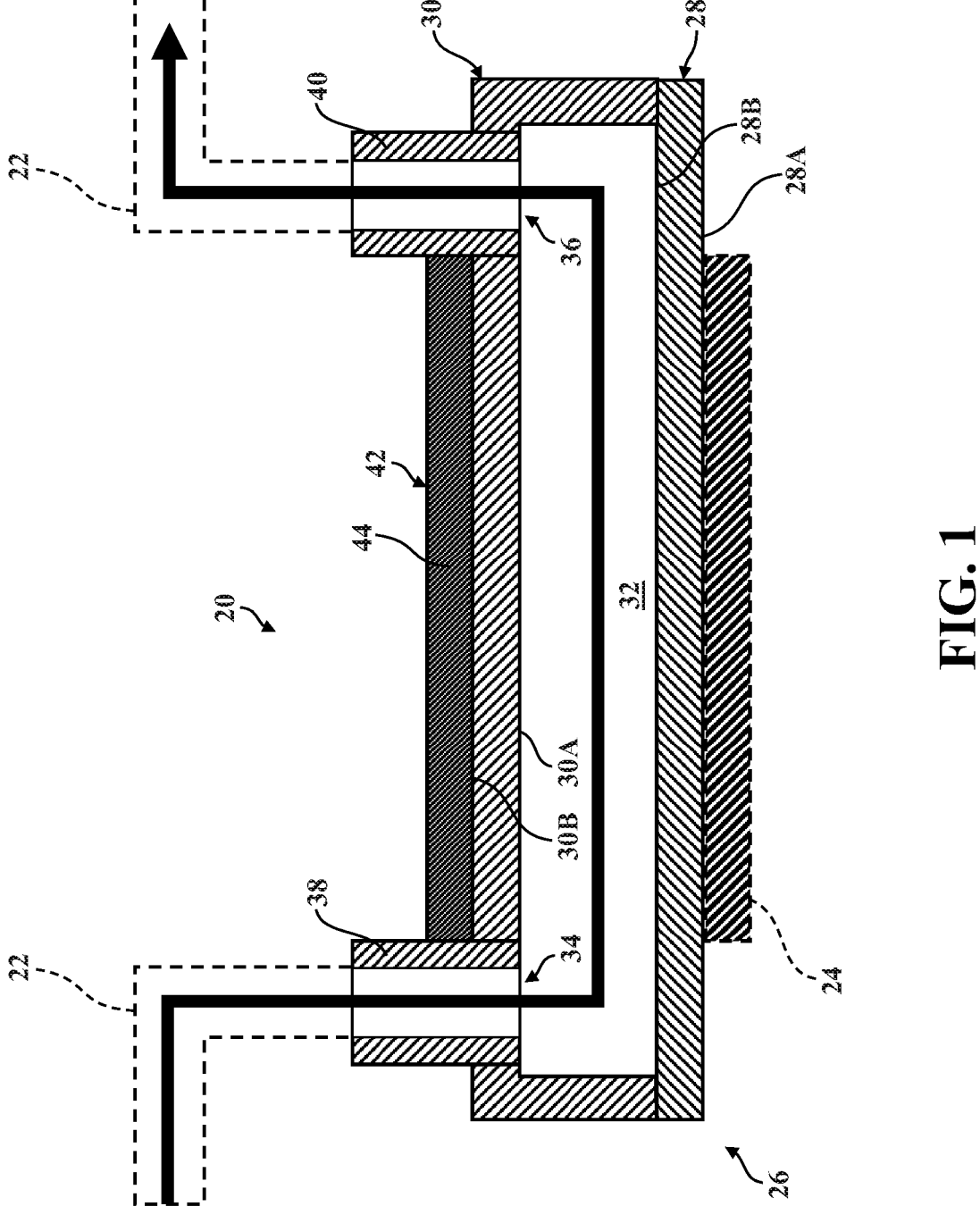
FIG. 1 is a schematic cross-sectional representation of one configuration of a heat exchange assembly configured to be coupled to a cooling loop of a vehicle for cooling an electronic component of the vehicle.

Referring to the drawings, wherein like reference numerals are used to identify like or identical components in the various views, FIG. 1 illustrates a heat exchange assembly 20. The heat exchange assembly 20 is configured to be coupled to a cooling loop 22 of a vehicle for cooling an electronic component 24 of the vehicle. The cooling loop 22 may be an arrangement of coolant passages disposed within the vehicle and configured to circulate a cooling fluid to various components of the vehicle to manage the temperature of such components. The cooling fluid may be any suitable cooling fluid for the application such as water, ethylene glycol, propylene glycol, and the like. In some examples, the electronic component 24 may be a power electronic component for distributing and/or converting electrical energy in the vehicle (e.g. to energize a compressor, electric motor, inverter, or the like in the vehicle). In these examples, the power electronic component, may comprise a metal-oxide-semiconductor field-effect transistor (MOSFET), insulated-gate bipolar transistor (IGBT), or the like. It should be appreciated that other electronic components 24 are contemplated, such as electronic components associated with the power electronic components of the vehicle, switches, inductors, capacitors, resistors, inverters, transformers, electric motors, batteries, central processing units (CPUs), graphics processing units (GPUs), application specific integrated circuits (ASICs), the like, or combinations thereof. In other words, the heat exchange assembly 20 may cool any electronic components 24 of the vehicle where temperature regulation is desirable.

Referring to FIG. 1, the heat exchange assembly 20 includes a heat exchange plate 26. The heat exchange plate 26 includes a base plate 28 and a shell 30. The base plate 28 includes a first surface 28A configured to be in thermal communication with the electronic component 24, and a second surface 28B opposite the first surface 28A. The shell 30 is coupled to the second surface 28B of the base plate 28. The shell 30 includes an inner shell surface 30A facing the second surface 28B of the base plate 28 such that a cooling chamber 32 is defined between the inner shell surface 30A and the second surface 28B of the base plate 28, and an outer shell surface 30B opposite the inner shell surface 30A. In some examples, the base plate 28 and the shell 30 are comprised of an aluminum alloy. One exemplary aluminum alloy is TRILLIUM® sold by Gränges AB, but other suitable aluminum alloys are contemplated. Additionally, in some examples, the shell 30 is brazed to the second surface 28B of the base plate 28. However, other configurations of coupling the shell 30 to the base plate 28 are contemplated such as welding, fasteners, and the like.

With continued reference to FIG. 1, the shell 30 defines a fluid inlet 34 and a fluid outlet 36. The fluid inlet 34 is in fluid communication with the cooling chamber 32 and is configured to be in fluid communication with the cooling loop 22 of the vehicle for providing a cooling fluid to the cooling chamber 32. The fluid outlet 36 is in fluid communication with the cooling chamber 32 and is configured to be in fluid communication with the cooling loop 22 of the vehicle for returning the cooling fluid to the cooling loop 22. In some examples, a first spigot 38 is disposed in the fluid inlet 34 for coupling the fluid inlet 34 to the cooling loop 22. Likewise, a second spigot 40 may be disposed in the fluid outlet 36 for coupling the fluid outlet 36 to the cooling loop 22.

Figure 4:
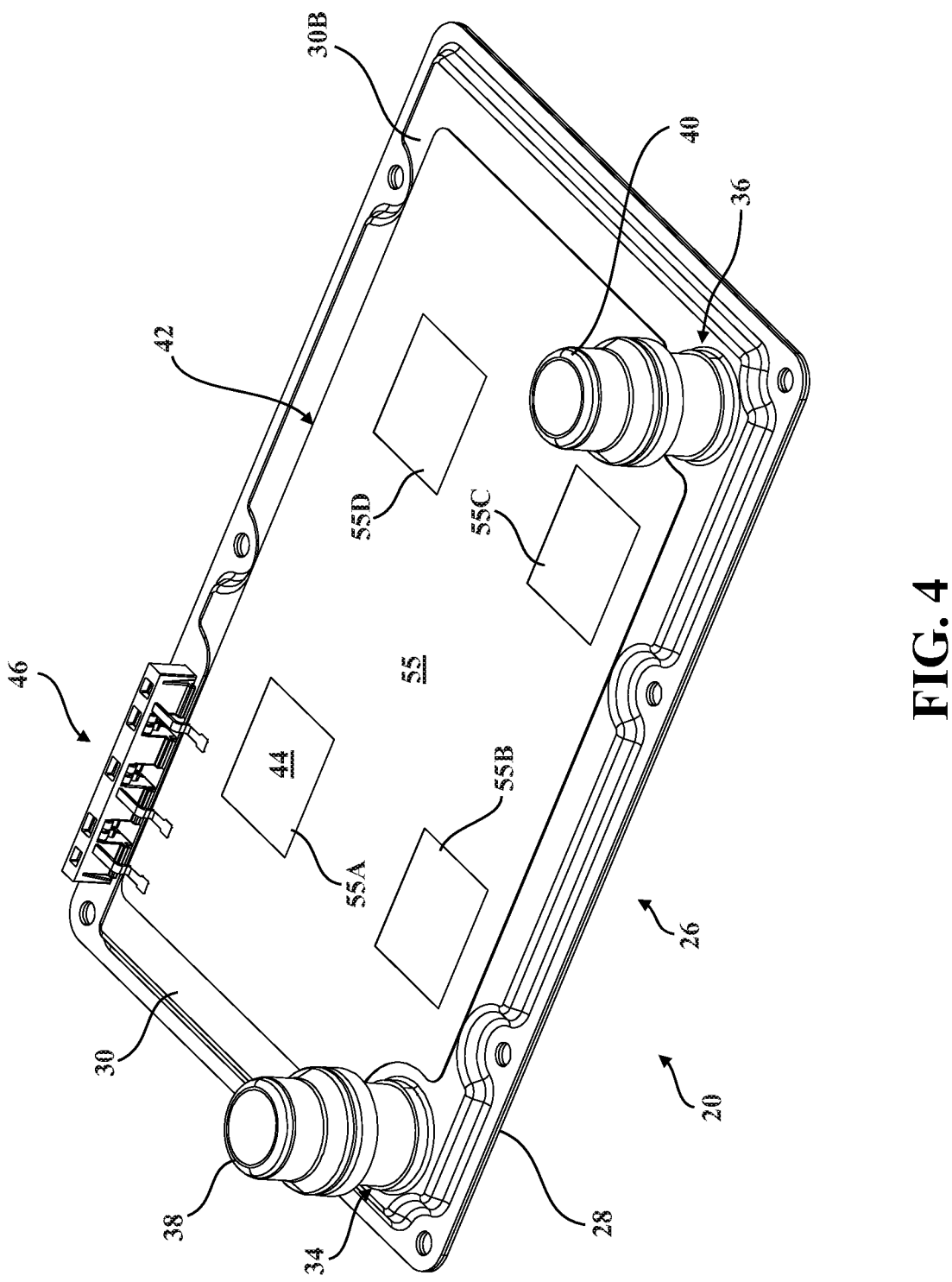
FIG. 4 is a top perspective view of yet another configuration of a heat exchange assembly.

Still referring to FIG. 1, the heat exchange assembly 20 also includes a resistive heating element 42 disposed on the outer shell surface 30B and in thermal communication with the cooling chamber 32 for heating the cooling fluid within the cooling chamber 32 to increase the temperature of the cooling fluid returned to the cooling loop 22 via the fluid outlet 36. The resistive heating element 42 may include a conductive layer 44 disposed on the outer shell surface 30B and having a resistance for generating heat in response to being energized to heat the cooling fluid within the cooling chamber 32. The conductive layer 44 may disposed on the outer shell surface 30B via an additive manufacturing process. For example, the conductive layer 44 may include one of a thermal spray coating and a printed circuit. As best shown in FIG. 4, in some examples, the heat exchange assembly 20 further includes a terminal assembly 46 arranged in electrical communication with the resistive heating element 42 to energize the resistive heating element 42 to generate heat. Other configurations of energizing the resistive heating element 42 are contemplated.

Figure 2:
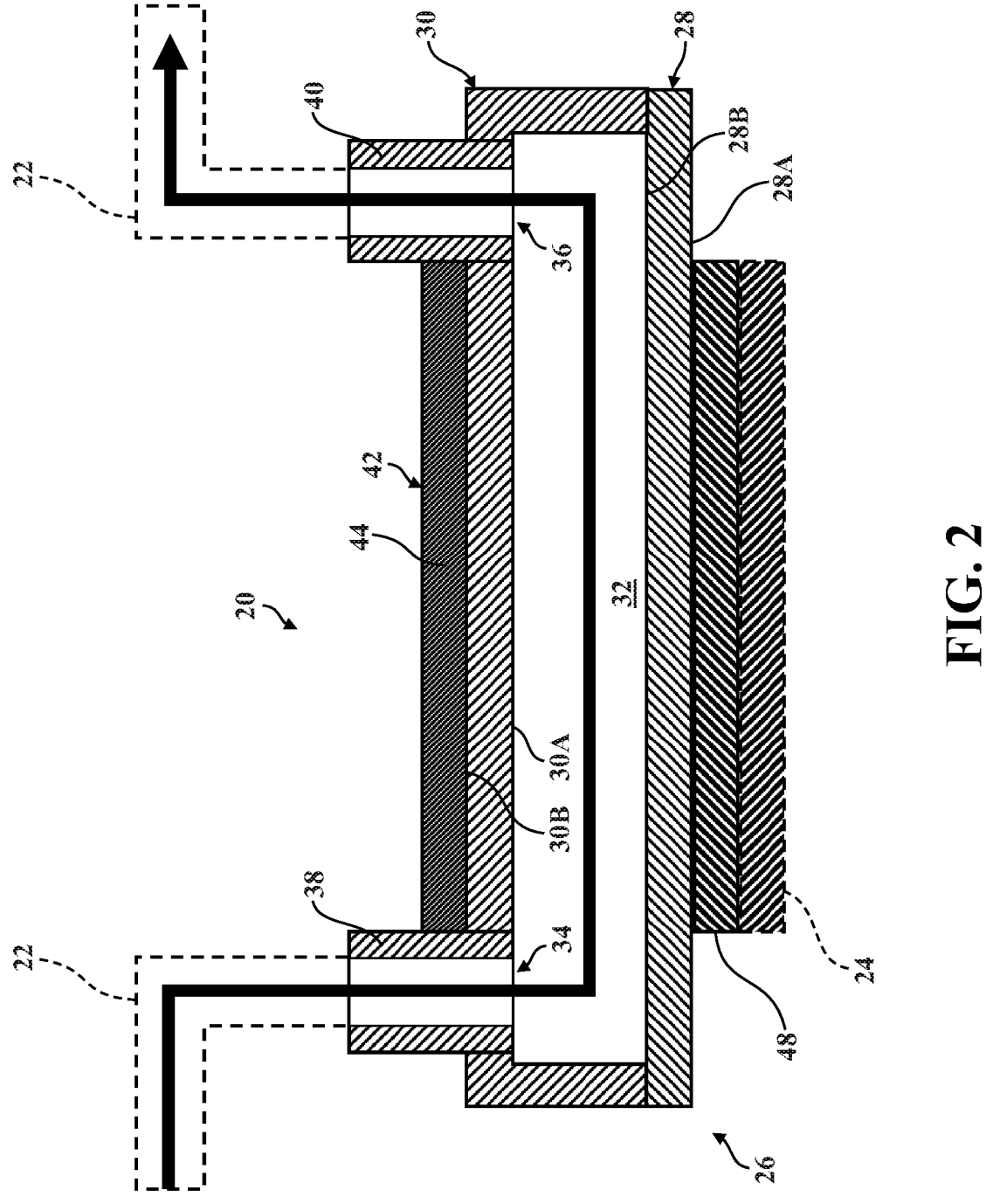
FIG. 2 is a schematic cross-sectional representation of another configuration of a heat exchange assembly including a heat sink.

A variety of configurations for arranging the first surface 28A in thermal communication with the electronic component 24 are contemplated. For example, as schematically illustrated in FIG. 1, the first surface 28A may configured to directly contact the electronic component 24. In other examples, referring to FIG. 2, the heat exchange assembly 20 may further include a heat sink 48 coupled to the first surface 28A of the base plate 28. The heat sink 48 may be configured to be coupled to the electronic component 24 such that the base plate 28 is in thermal communication with the electronic component 24. The heat sink 48 may comprise copper, but other materials having suitable heat transfer characteristics are contemplated.

Figure 3:
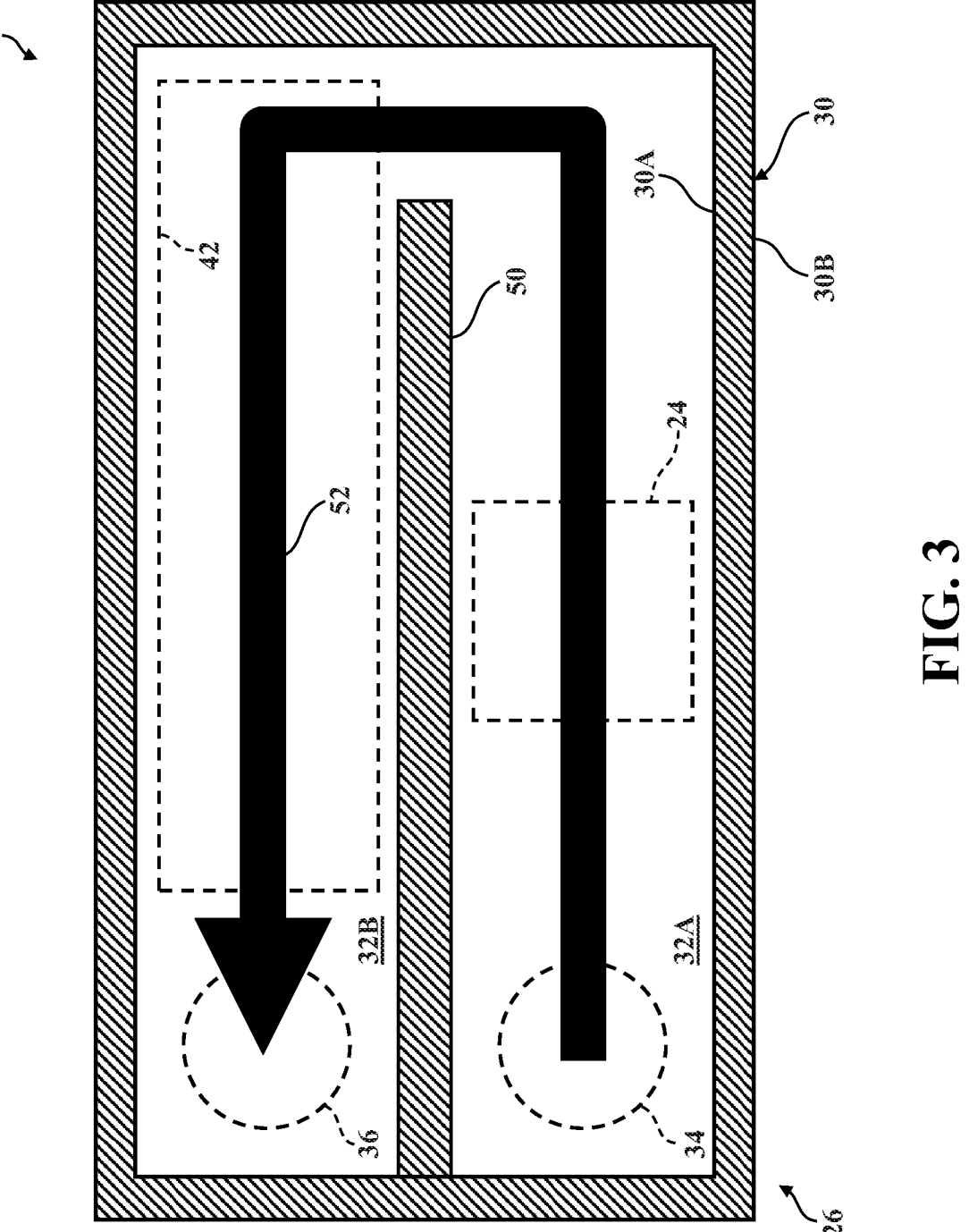
FIG. 3 is a schematic cross-sectional representation of another configuration of a heat exchange assembly where a baffle subdivides a cooling chamber into a first cooling chamber and a second cooling chamber.

Referring to FIG. 3, in some examples, the inner shell surface 30A further defines a baffle 50 that subdivides the cooling chamber 32 into a first cooling chamber 32A and a second cooling chamber 32B. The first cooling chamber 32A may be in fluid communication with the fluid inlet 34 and configured to be in thermal communication with the electronic component 24. The second cooling chamber 32B may be in fluid communication with the first cooling chamber 32A and the fluid outlet 36 and in thermal communication with the resistive heating element 42. Accordingly, as generally illustrated by arrow 52 in FIG. 3, the heat exchange plate 26 may be configured such that the cooling fluid flow sequentially i) from the cooling loop 22 and through the fluid inlet 34 to the first cooling chamber 32A to cool the electronic component 24, ii) from the first cooling chamber 32A to the second cooling chamber 32B such that the resistive heating element 42 increases the temperature of the cooling fluid, and iii) from the second cooling chamber 32B and through the fluid outlet 36 to return the cooling fluid to the cooling loop 22.

FIGS. 4-10D show one exemplary configuration of the heat exchange assembly 20. As best shown in the exploded view of FIG. 5, the shell 30 may be comprised of a stamped plate. Here, the shell 30 defines the defines the fluid inlet 34 at one end of the shell 30 and the fluid outlet 36 at another end of the shell 30 such that the cooling fluid flows within the cooling chamber 32 from the fluid inlet 34 to the fluid outlet 36. Although not illustrated in FIGS. 4-10D, it should be appreciated that the shell 30 may define indentation(s) 54 that define the baffle 50 for subdividing the cooling chamber into a first cooling chamber 32A and a second cooling chamber 32B, as described above. For example, the indentation(s) 54 may extend toward the base plate 28 and abut the base plate 28 to define the first cooling chamber 32A on one side of the indentation(s) 54 and the second cooling chamber 32B on the other side of the indentation(s) 54. As described in further detail below, the shell 30 may also define other indentation(s) 54 to direct the flow of cooling fluid within the cooling chamber 32.

With continued reference to FIGS. 4-10D, the resistive heating element 42 of the illustrated configuration is disposed on the outer shell surface 30B and in thermal communication with the cooling chamber 32 for heating the cooling fluid within the cooling chamber 32 to increase the temperature of the cooling fluid returned to the cooling loop 22 via the fluid outlet 36. In some configurations, the heat exchange assembly 20 also includes an insulation layer 55 disposed on the resistive heating element 42 to prevent waste heat from emanating away from the heat exchange assembly 20. It should be appreciated that in some configurations the insulation layer 55 defines voids where the base plate 28 is configured to be arranged in thermal communication with the electronic component(s) 24 to allow heat to escape those regions. For example, FIGS. 4-10D illustrate four devoid regions 55A, 55B, 55C, and 55D of the insulation layer 55 which corresponds to the regions of the base plate 28 where the base plate 28 is configured to be arranged in thermal communication with the electronic components 24. The illustrated configuration also shows the terminal assembly 46 for energizing the resistive heating element 42 disposed on the outer shell surface 30B, but other configurations are contemplated.

Figure 5:
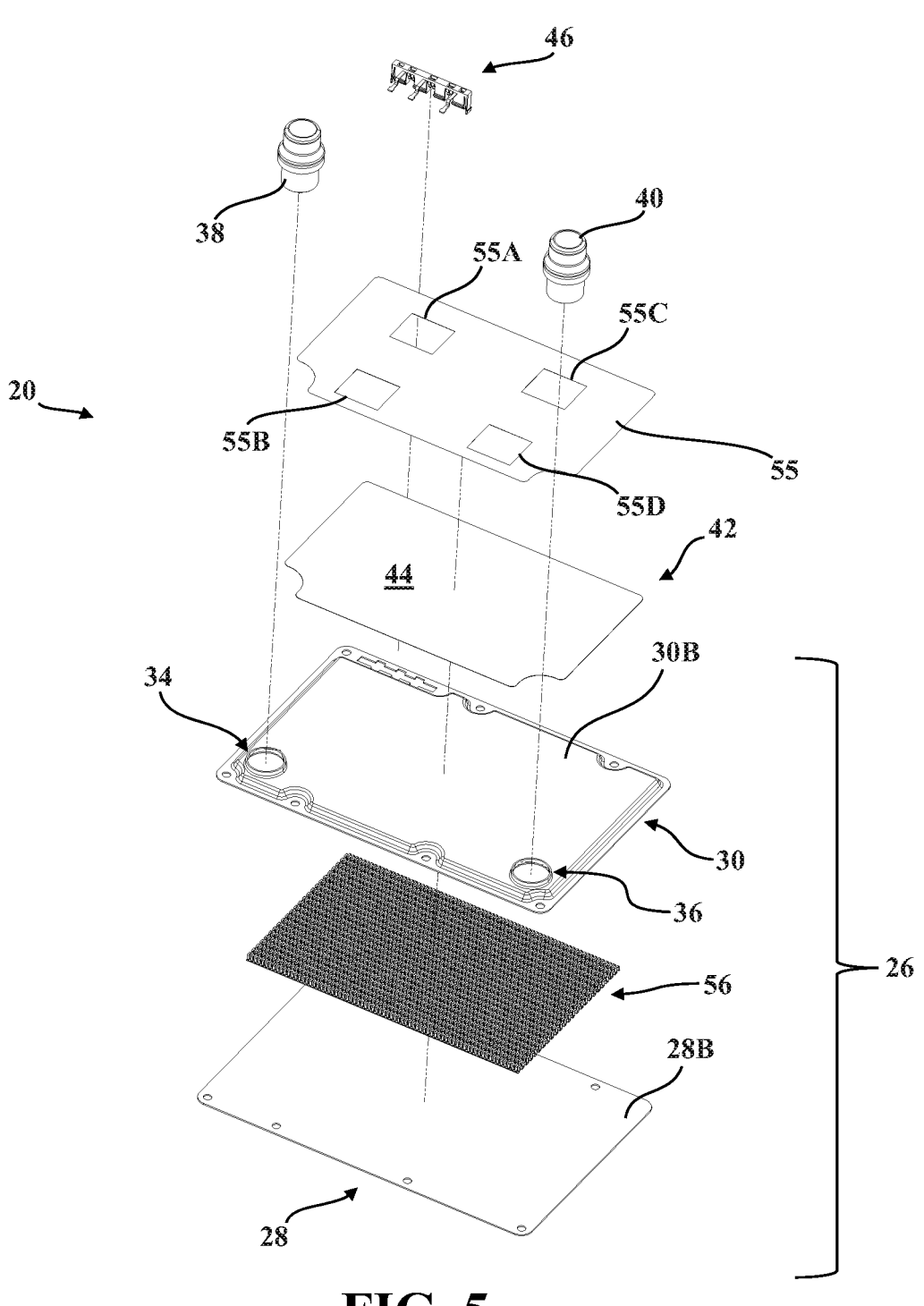
FIG. 5 is an exploded view of the heat exchange assembly of FIG. 4.
Figures 6, 7:
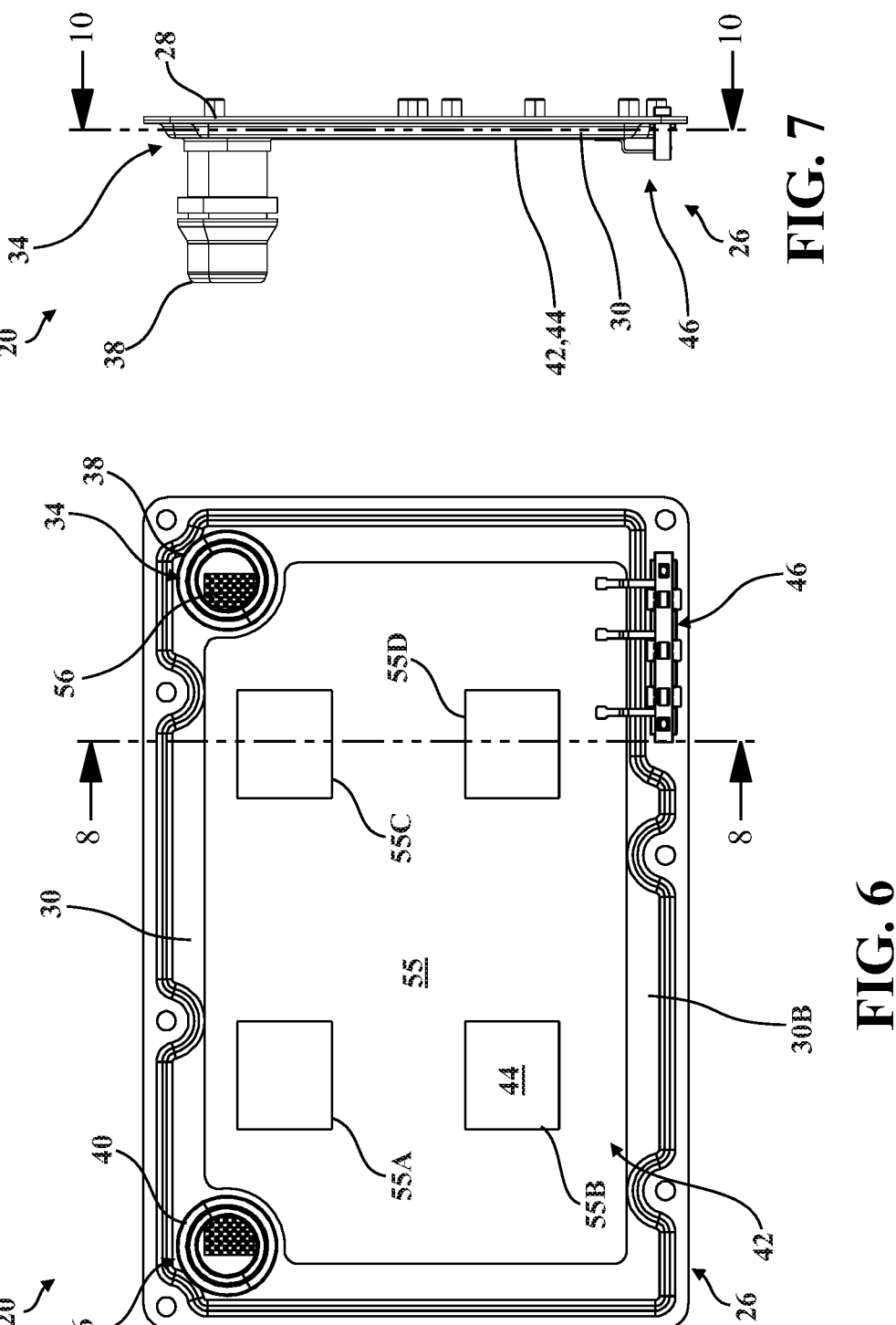
FIG. 6 is a top view of the heat exchange assembly of FIG. 4.
FIG. 7 is a side view of the heat exchange assembly of FIG. 4.

As best shown in the exploded view of FIG. 5, in some examples, the heat exchange assembly 20 further includes a plurality of fins 56 disposed in the cooling chamber 32. Referring to FIGS. 10A, 10B, 10C, and 10D, as generally indicated by arrow 58, the plurality of fins 56 may be arranged to distribute flow of the cooling fluid throughout the cooling chamber 32. The plurality of fins 56 may comprise a similar or dissimilar material to the base plate 28 and the shell 30.

Figure 9A:
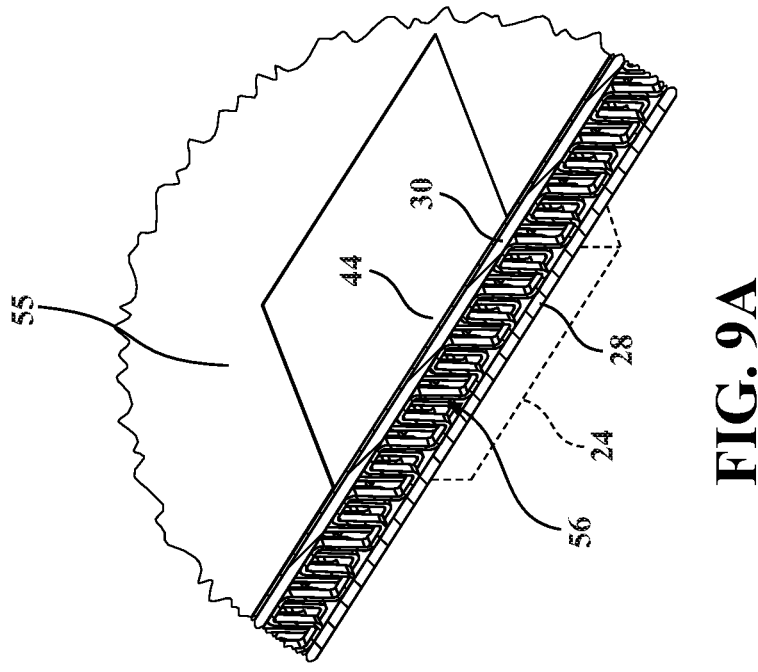
FIGS. 9A-9D are detailed views of the perspective cross-sectional views of FIGS. 8A-8D, respectively.
Figure 8A:
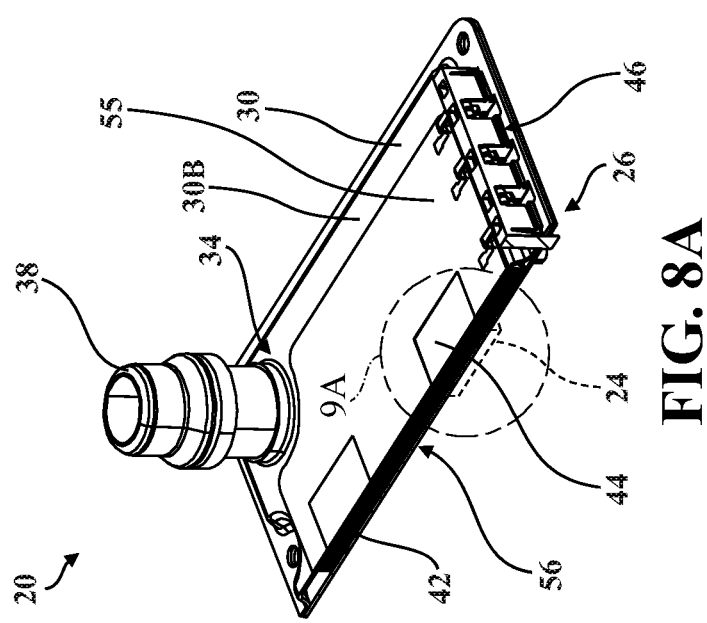
FIGS. 8A-8D are perspective cross-sectional views of various configurations of the heat exchange assembly of FIG. 6 taken through line 8-8.
Figure 9B:
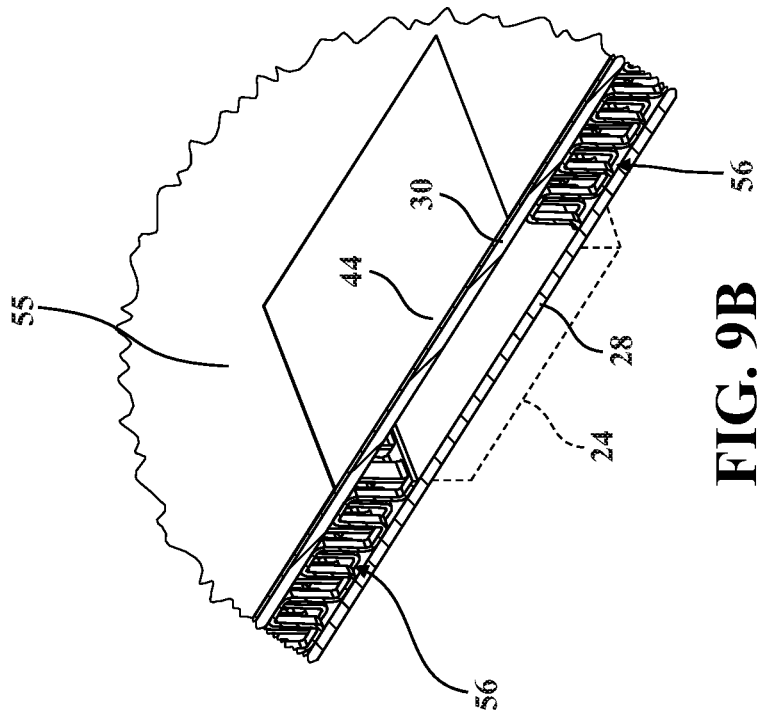
Figure 8B:
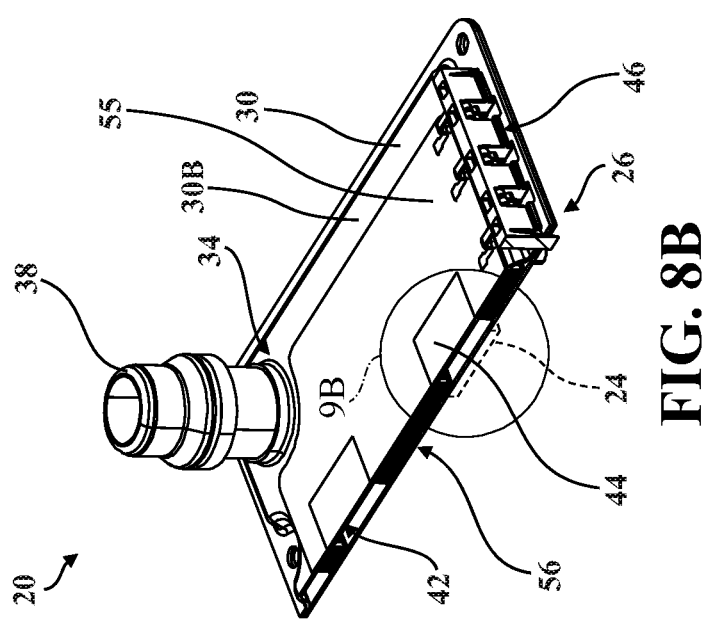
Figure 9C:
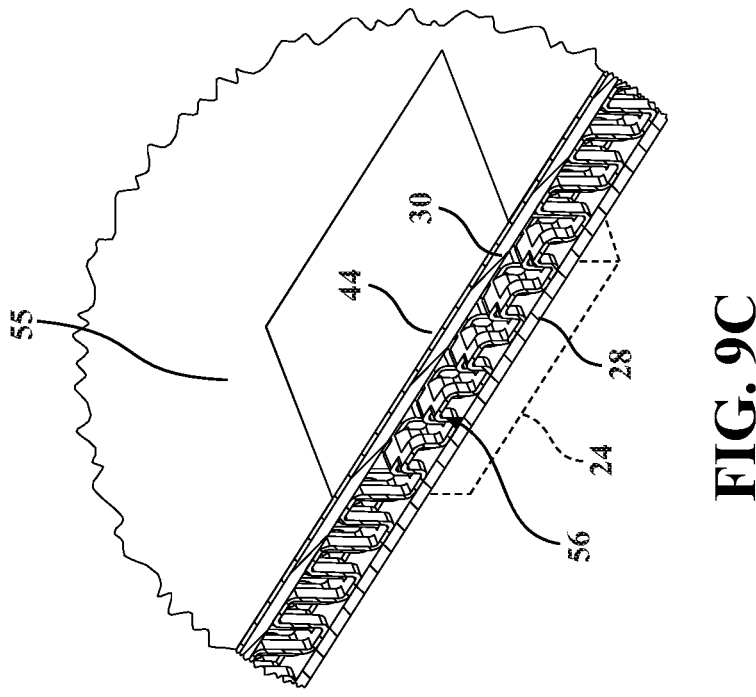
Figure 8C:
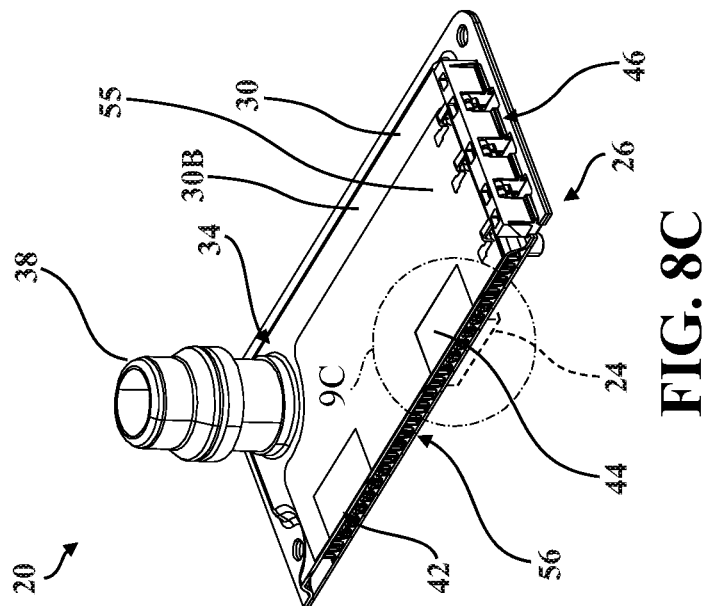
Figure 9D:
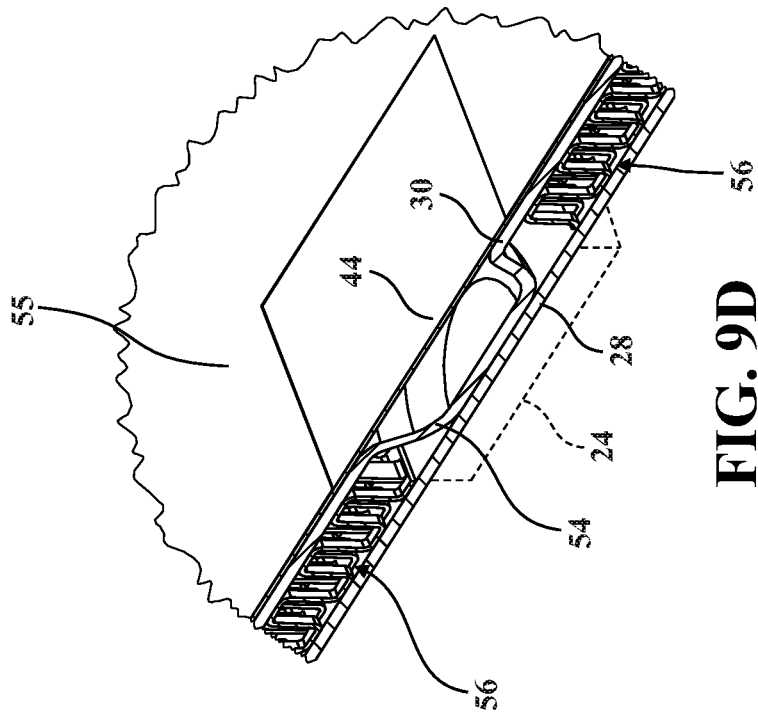
Figure 8D:
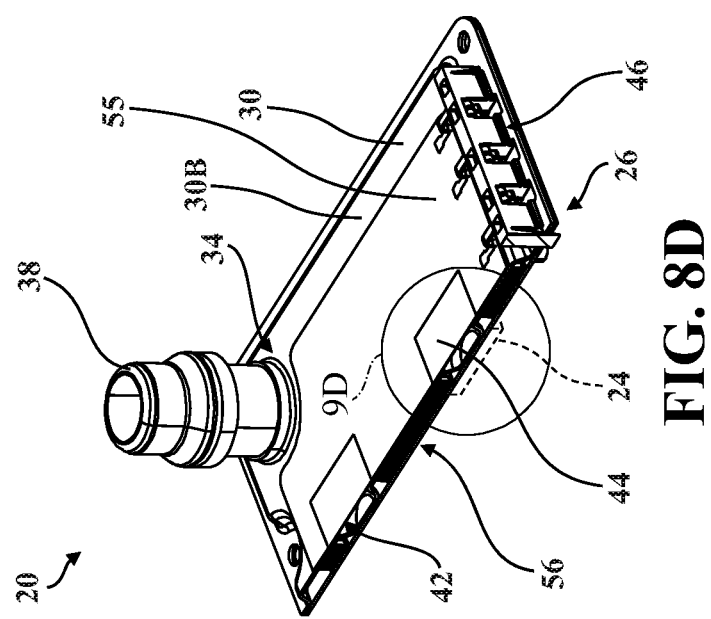
Figure 10A:
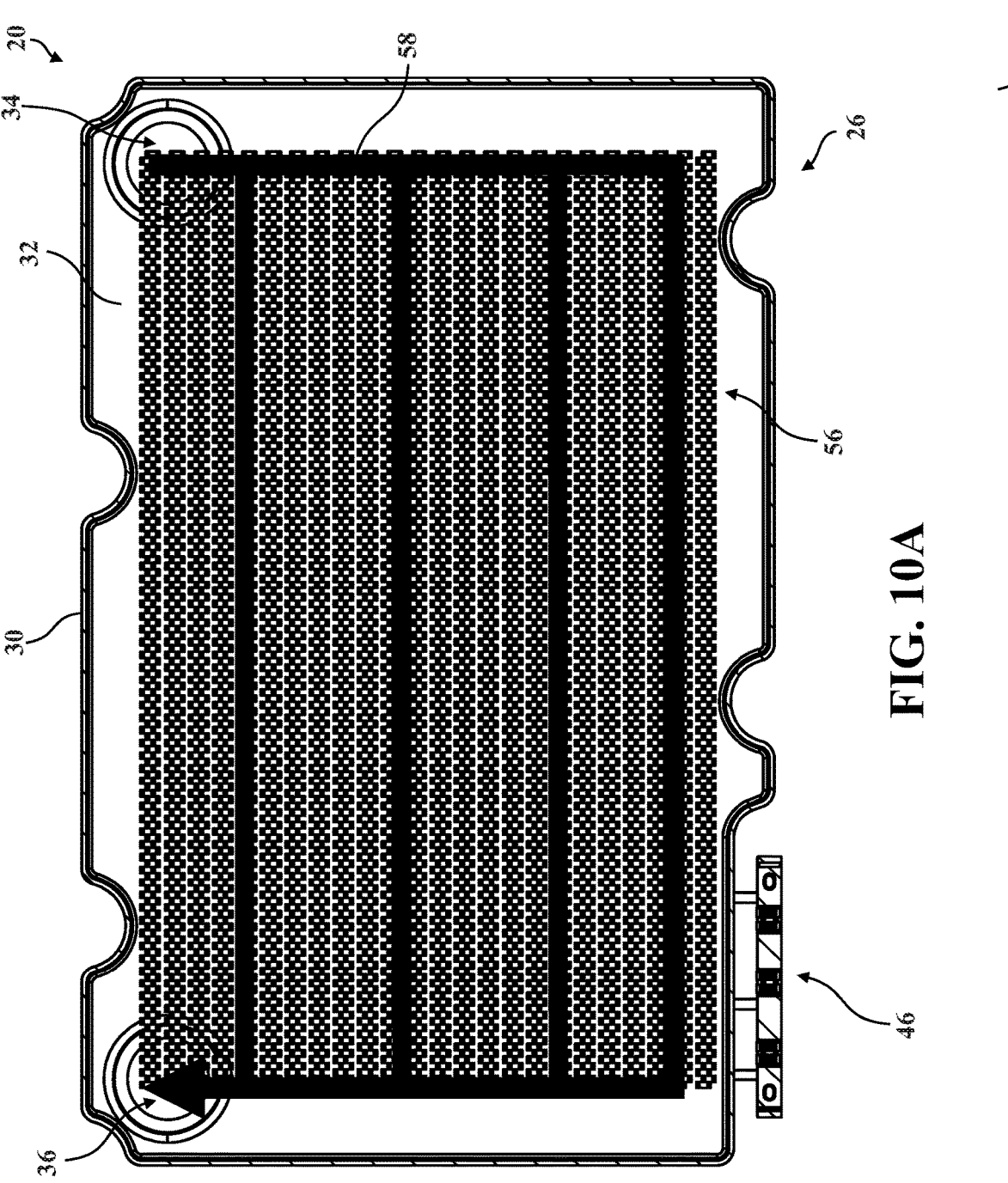
FIGS. 10A-10D are a partially schematic cross-sectional representations of various configurations of the heat exchange assembly of FIG. 7 taken through line 10-10 and including an arrow generally indicating the flow of a cooling fluid throughout the heat exchange assembly.
Figure 10B:
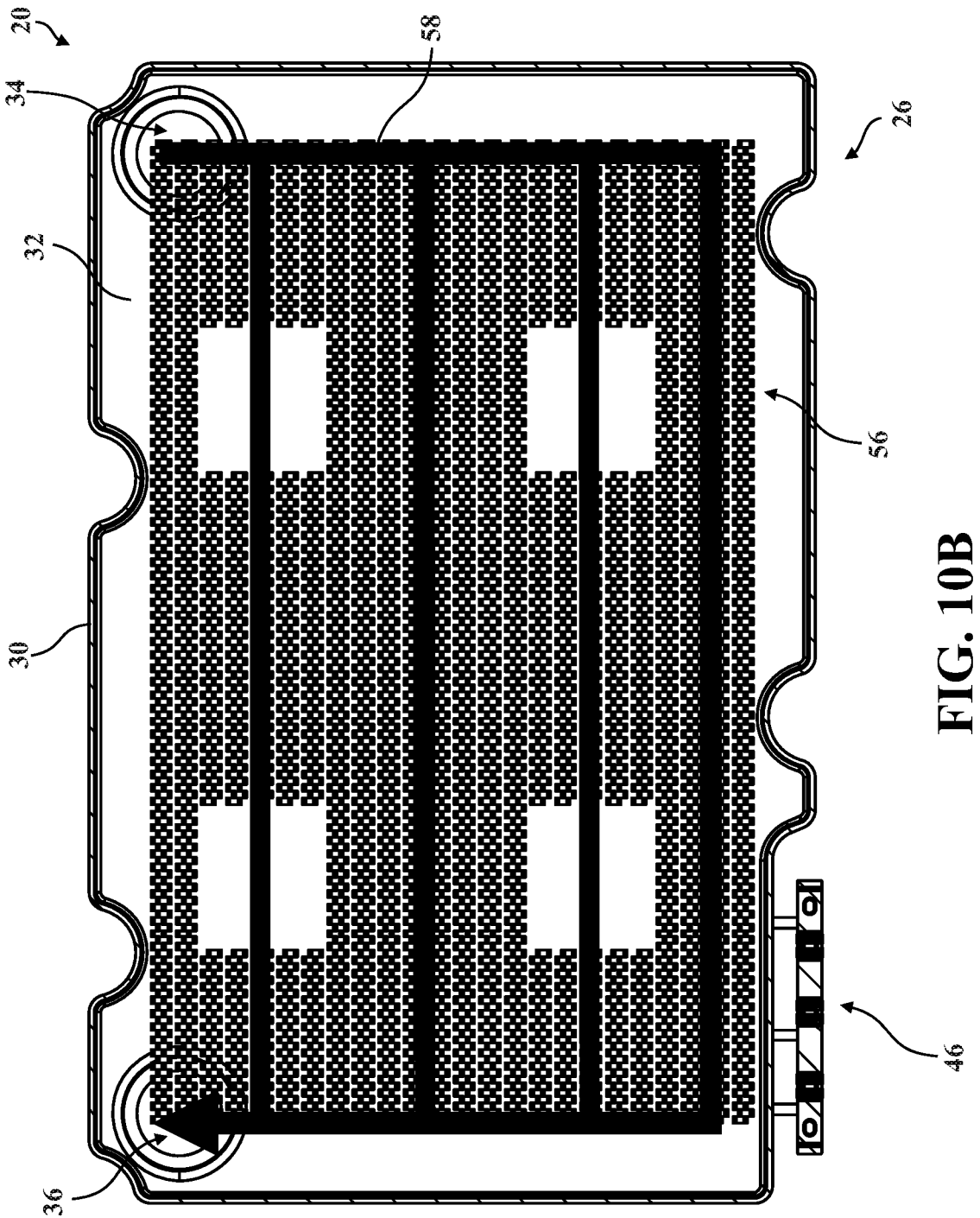
Figure 10C:
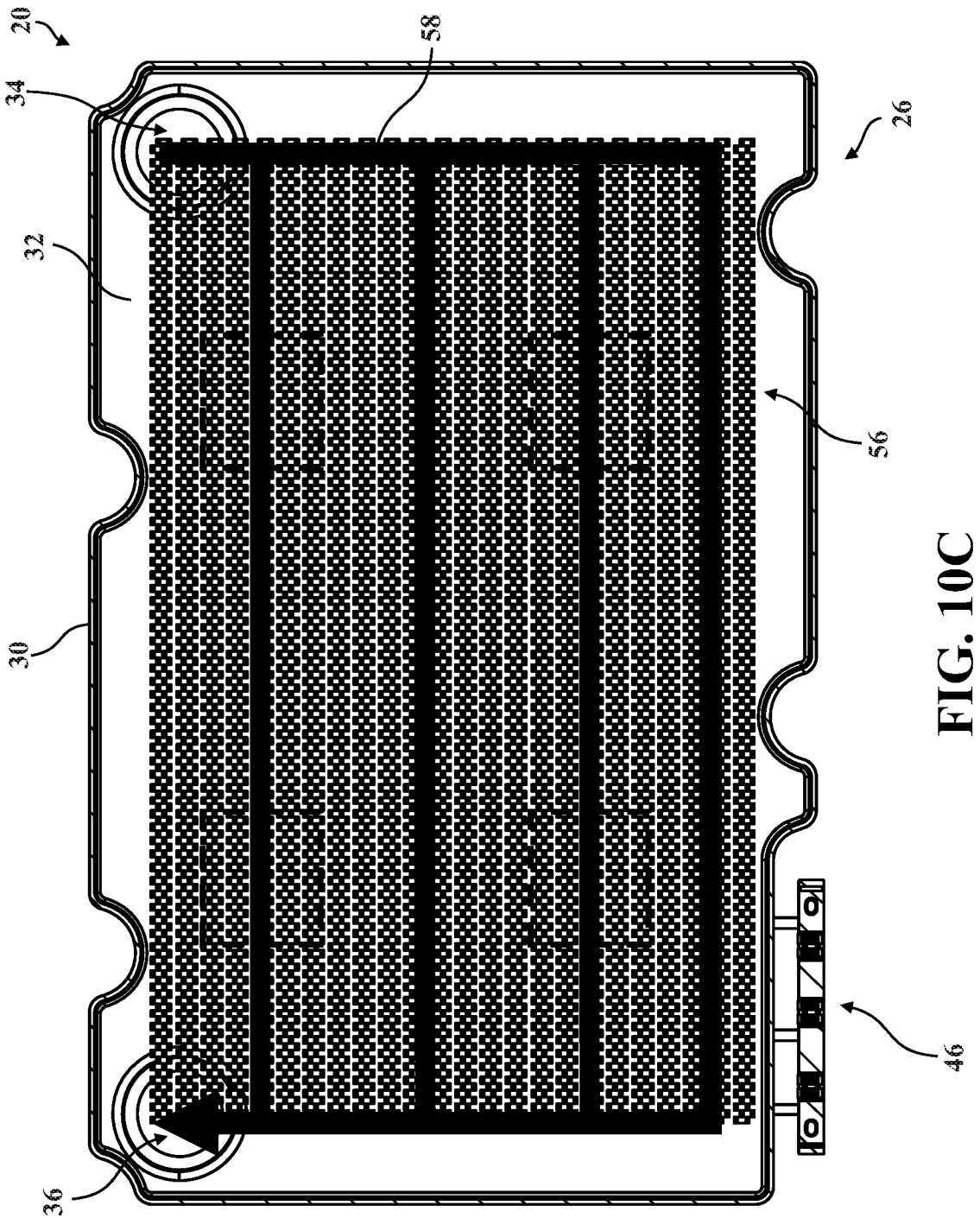
Figure 10D:
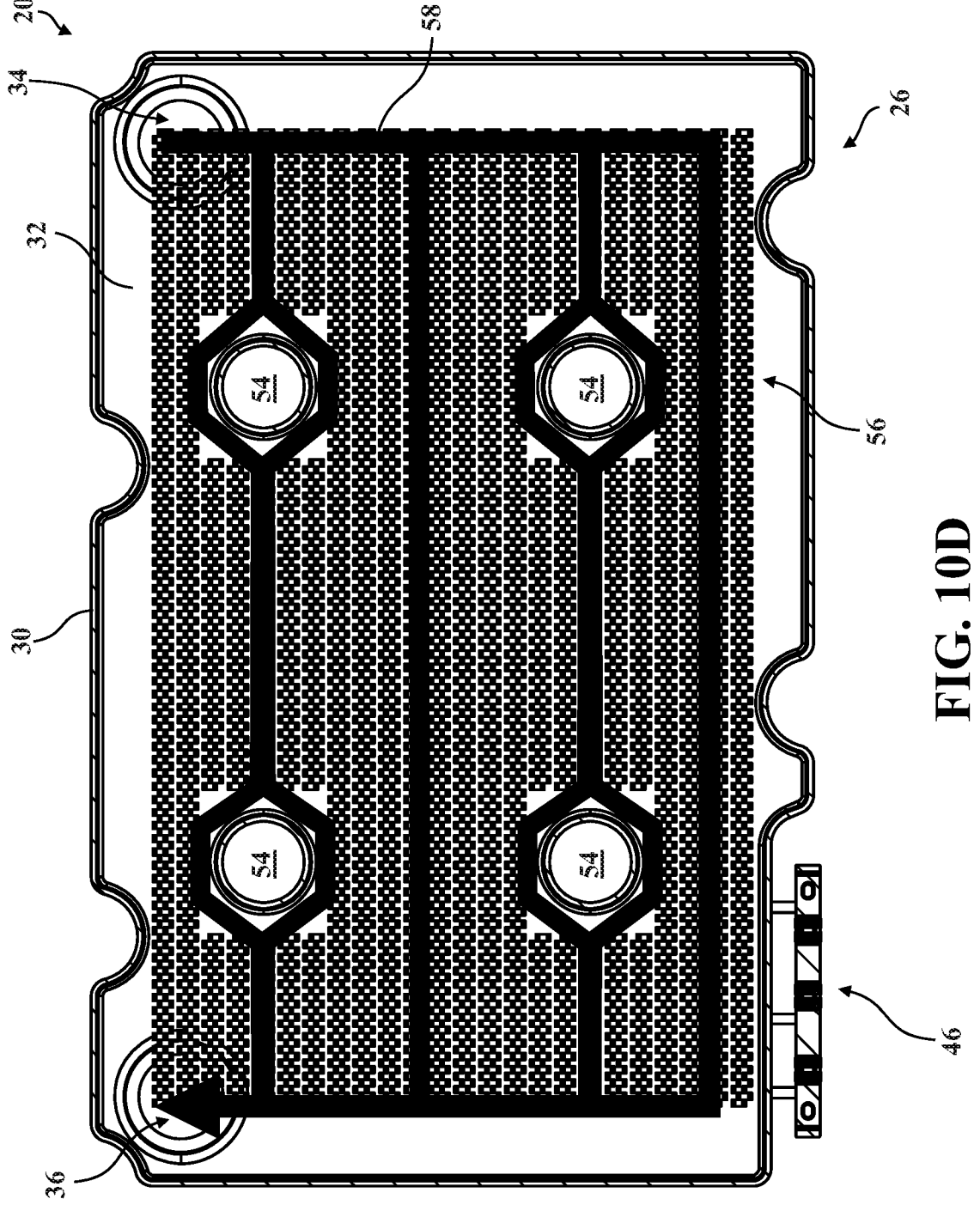
Figure 11:
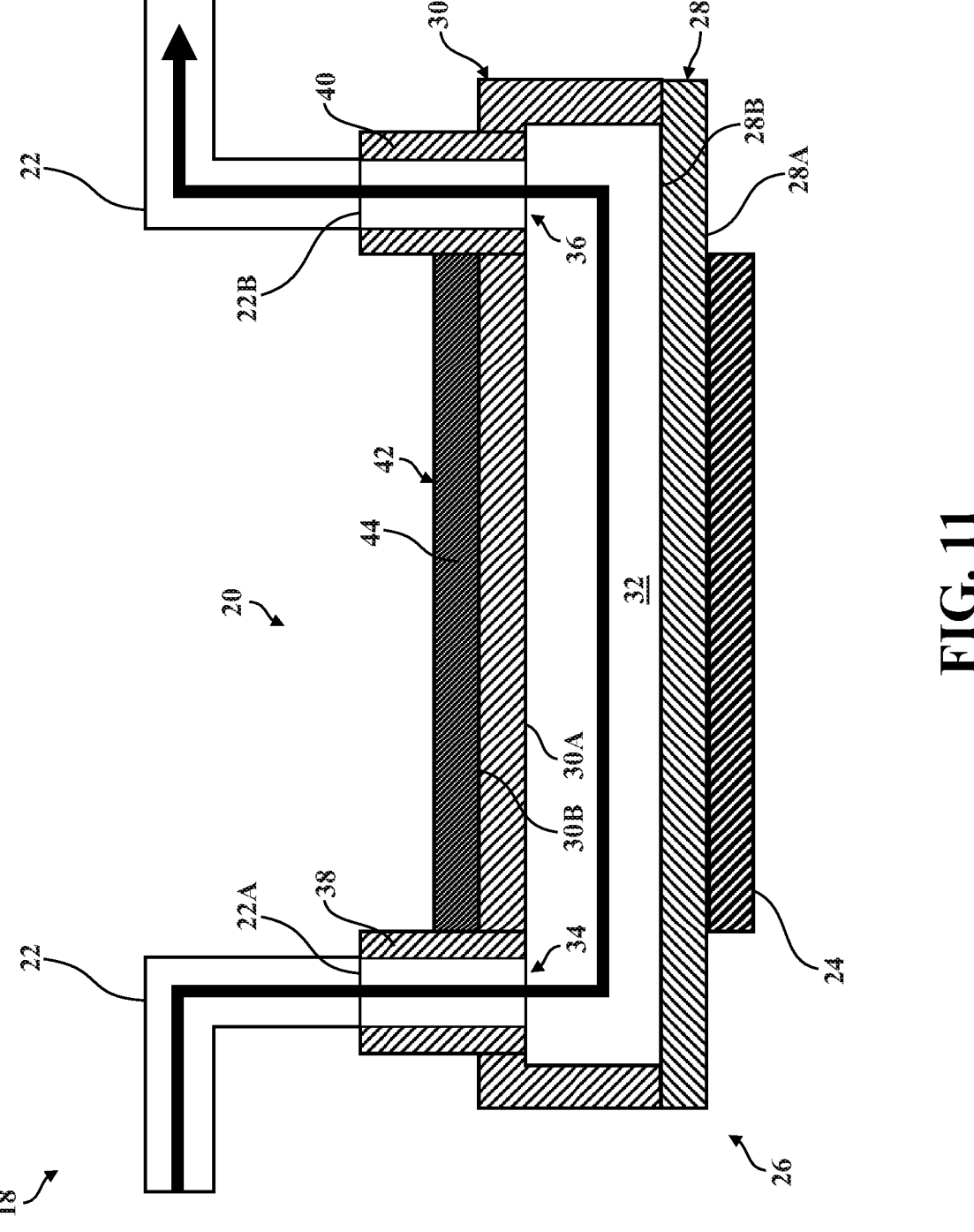
FIG. 11 is a schematic cross-sectional representation of a thermal management system including a cooling loop and a heat exchange assembly coupled to the cooling loop for cooling an electronic component.

A variety of configurations of the plurality of fins 56 are contemplated. In some examples, as best shown in FIGS. 8A, 9A, and 10A, the plurality of fins 56 extend from the second surface 28B of the base plate 28 to the inner shell surface 30A. However, in other examples, it may be desirable to limit heat transfer between the resistive heating element 42 and the region(s) of the base plate 28 where the base plate 28 is configured to be arranged in thermal communication with the electronic component(s) 24. Accordingly, the cooling chamber 32 may be at least partially devoid of the plurality of fins 56 in region(s) of the cooling chamber 32 aligned with region(s) of the base plate 28 where the base plate 28 is configured to be arranged in thermal communication with the electronic component 24. In one example, referring to FIGS. 8B, 9B, and 10B, the cooling chamber 32 is devoid of the plurality of fins 56 in the region(s) of the cooling chamber 32 aligned with the region (s) of the base plate 28 where the base plate 28 is configured to be arranged in thermal communication with the electronic component(s) 24 to limit heat transfer therebetween. In another example, referring to FIGS. 8C, 9C, and 10C, the plurality of fins 56 extend only partially between the second surface 28B of the base plate 28 to the inner shell surface 30A (indicated with phantom outlines in FIG. 10D) to limit heat transfer therebetween. In yet another example, referring to FIGS. 8D, 9D, and 10D, the shell 30 defines one or more indentations 54, with each of the indentation(s) 54 respectively extending into the region(s) of the cooling chamber 32 aligned with the region(s) of the base plate 28 where the base plate 28 is configured to be arranged in thermal communication with the electronic component(s) 24. In this configuration, the indentation(s) 54 alter(s) the pressure of the cooling fluid flowing through the cooling chamber 32 in the region(s) of the base plate 28 where the base plate 28 is configured to be arranged in thermal communication with the electronic component(s) 24 to achieve desired flow of the cooling fluid flowing through the cooling chamber 32. Other configurations for distributing flow of the cooling fluid throughout the second cooling chamber 32B are contemplated.

Referring to FIGS. 11-14, another aspect of the present disclosure is directed to a thermal management system 18. The thermal management system 18 includes the electronic component 24, as described above. The thermal management system 18 also includes the cooling loop 22 for circulating a cooling fluid, as described above. Here, the cooling loop 22 includes at least a first outlet port 22A for providing a cooling fluid and a first return port 22B for receiving the cooling fluid. The thermal management system 18 further includes the heat exchange assembly 20, as shown and described above. It should be appreciated that heat exchange assembly 20 of the thermal management system 18 may have any configuration described above in the context of FIGS. 1-10D. The thermal management system 18 includes the heat exchange plate 26, as shown and described above. Here, the first surface 28A of the base plate 28 is arranged in thermal communication with the electronic component 24 (e.g., via the heat sink 48 interposed between the first surface 28A of said base plate 28 and the electronic component 24, as shown and described above in the context of FIG. 2). Additionally, the fluid inlet 34 is in fluid communication with the cooling chamber 32 and the first outlet port 22A of the cooling loop 22 for providing the cooling fluid to the cooling chamber 32. The fluid outlet 36 is in fluid communication with the cooling chamber 32 and the first return port 22B of the cooling loop 22 for returning the cooling fluid to the cooling loop 22. The thermal management system 18 also further includes the resistive heating element 42 disposed on the outer shell surface 30B and in thermal communication with the cooling chamber 32 for heating the cooling fluid within the cooling chamber 32 to increase the temperature of the cooling fluid returned to the cooling loop 22.

Figure 12:
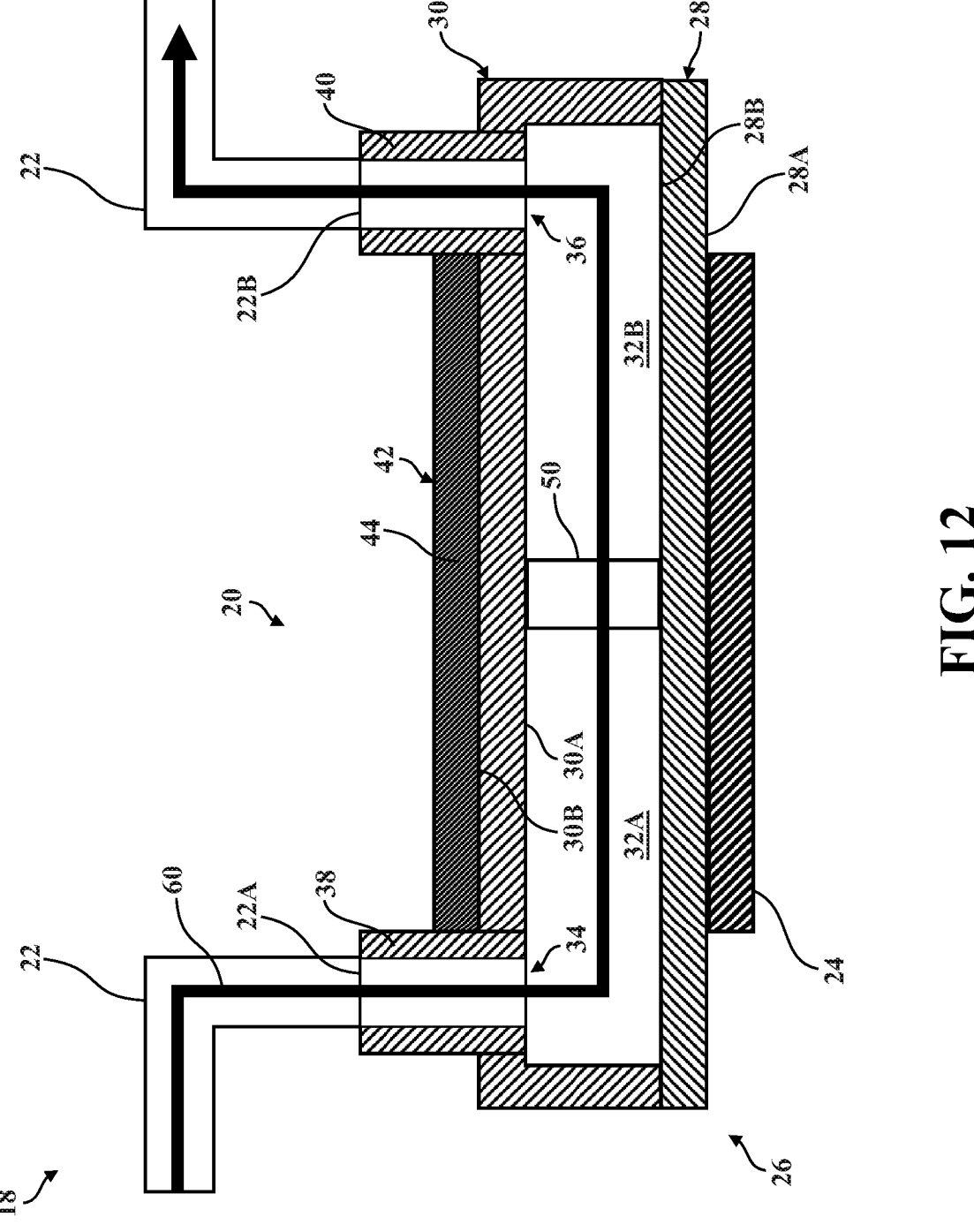
FIG. 12 is a schematic cross-sectional representation of the thermal management system of FIG. 11 where a baffle subdivides a cooling chamber into a first cooling chamber and a second cooling chamber.

Referring to FIG. 12, it should also be appreciated that the inner shell surface 30A may define the baffle 50 that subdivides the cooling chamber 32 into the first cooling chamber 32A and the second cooling chamber 32B, as shown and described above in the context of FIG. 3. Accordingly, as generally indicated by arrow 60 in FIG. 12, the heat exchange plate 26 of the thermal management system 18 may be configured such that the cooling fluid flows sequentially i) from the first outlet port 22A of the cooling loop 22 and through the fluid inlet 34 to the first cooling chamber 32A to cool the electronic component 24, ii) from the first cooling chamber 32A to the second cooling chamber 32B such that the resistive heating element 42 increases the temperature of the cooling fluid, and iii) from the second cooling chamber 32B and through the fluid outlet 36 and to the first return port 22B of the cooling loop 22 to return the cooling fluid to the cooling loop 22.

Figure 13:
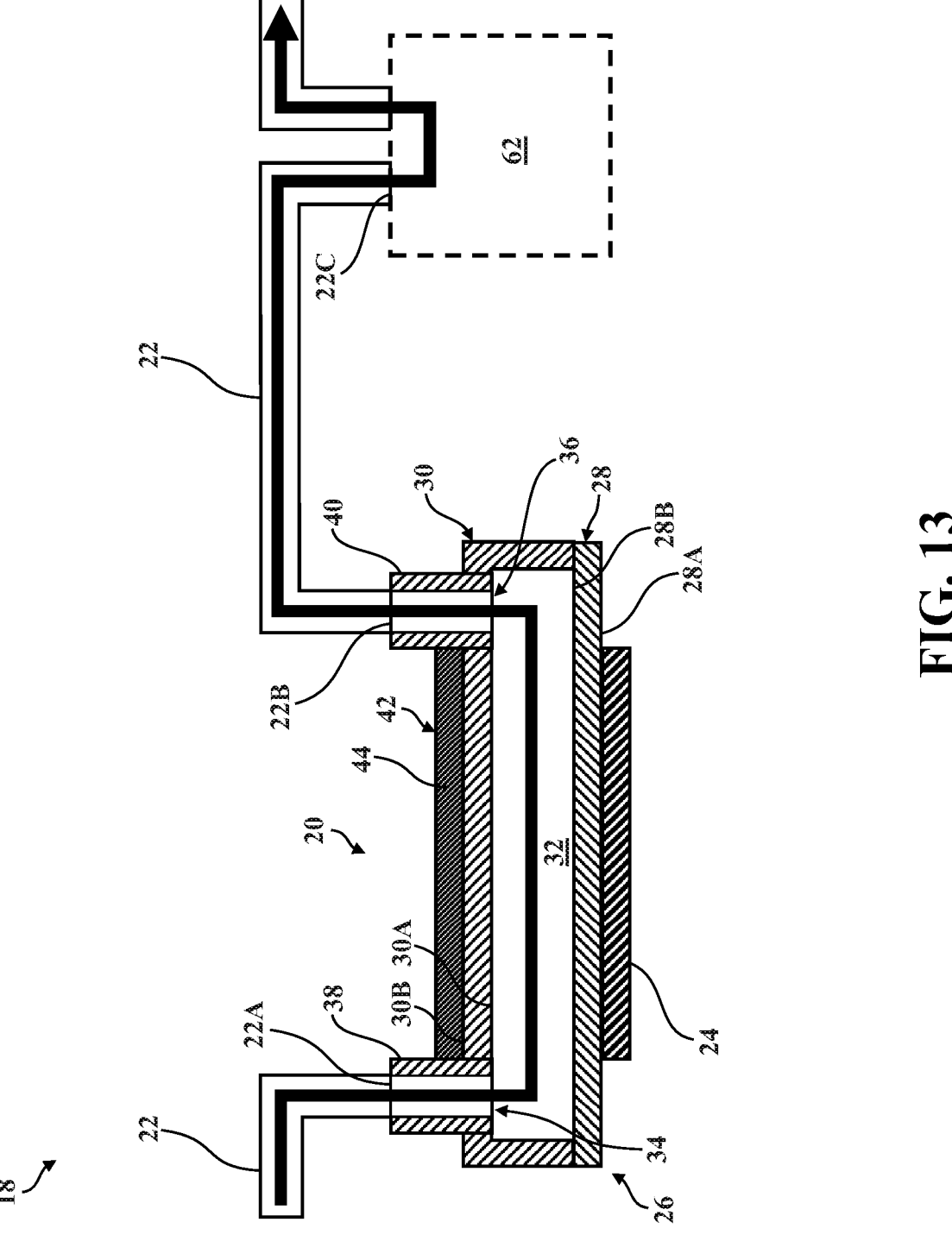
FIG. 13 is a schematic cross-sectional representation of a thermal management system of FIG. 11 further including a second component downstream in the cooling loop.
Figure 14:
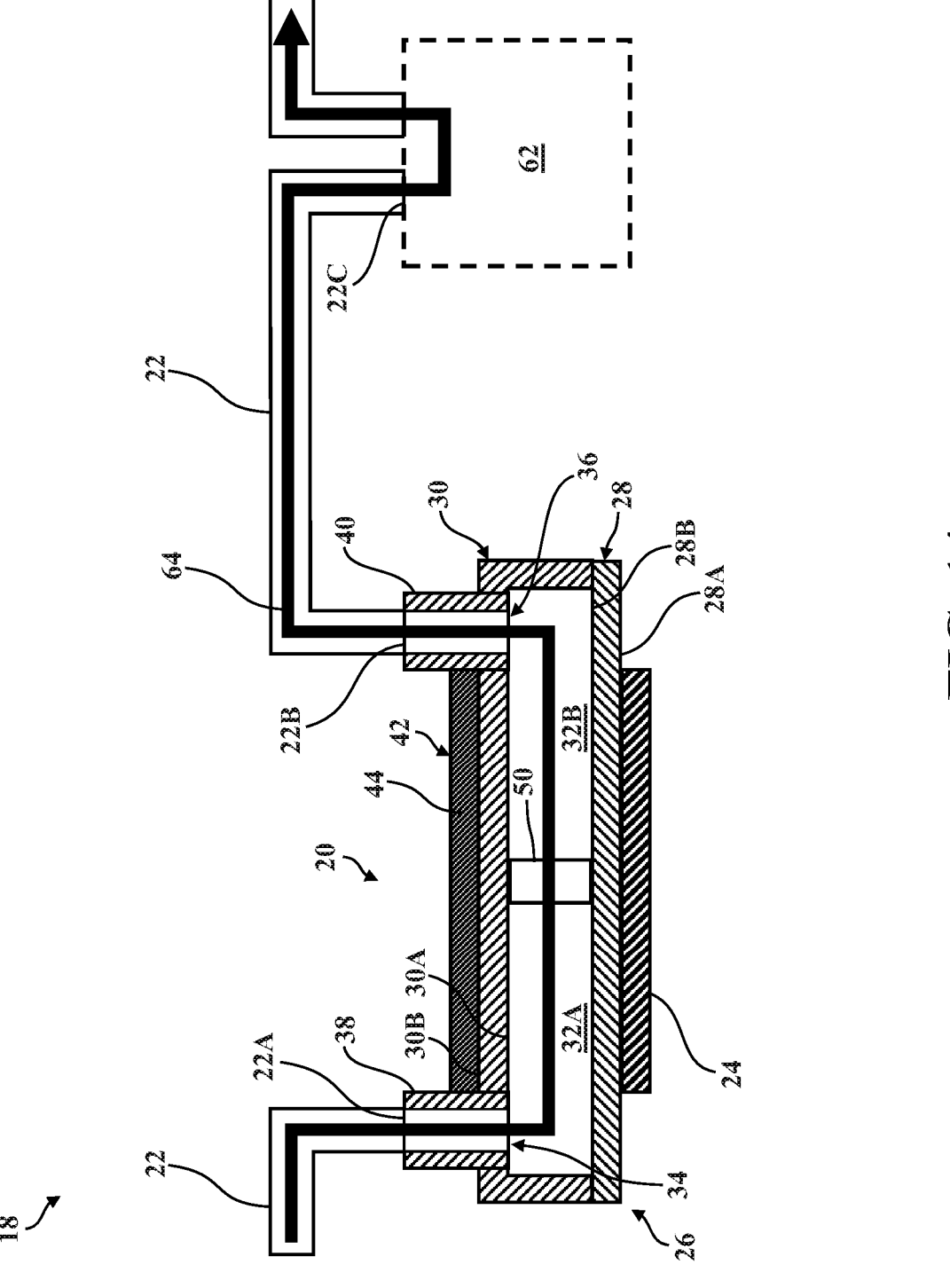
FIG. 14 is a schematic cross-sectional representation of the thermal management system of FIG. 13 where a baffle subdivides a cooling chamber into a first cooling chamber and a second cooling chamber.

Referring to FIG. 13, in some examples, the cooling loop 22 further includes a second outlet port 22C. The second outlet port 22C is downstream in the cooling loop 22 from the first return port 22B. The second outlet port 22C in thermal communication with a second component 62 to heat the second component 62. In other words, the thermal management system 18 may be configured to remove heat from the electronic component 24 and add heat to the second component 62. Referring to FIG. 14, in examples where the baffle 50 subdivides the cooling chamber 32 into the first cooling chamber 32A and the second cooling chamber 32B, as generally indicated by arrow 64, the heat exchange plate 26 of the thermal management system 18 is configured such that the cooling fluid flows sequentially i) from the first outlet port 22A of the cooling loop 22 and through the fluid inlet 34 to the first cooling chamber 32A to cool the electronic component 24, ii) from the first cooling chamber 32A to the second cooling chamber 32B such that the resistive heating element 42 increases the temperature of the cooling fluid, iii) from the second cooling chamber 32B and through the fluid outlet 36 and to the first return port 22B of the cooling loop 22 to return the cooling fluid to the cooling loop 22, and iv) to the second outlet port 22C of said cooling loop 22 to heat said second component 62.

The second component 62 may be any component where it is desirable to add heat to the component. For example, the second component 62 may be one of a vehicle battery and a vehicle cabin heat exchanger. In these examples, during operation of an electric vehicle, especially during initial operation of the electric vehicle where the electric vehicle is subject to relatively cold ambient temperatures, it is desirable to heat the vehicle battery and/or the vehicle cabin via a vehicle cabin heat exchanger to a desired operating temperature. However, it is also desirable to simultaneously cool the electronic component 24 of the vehicle. Accordingly, by arranging the heat exchange assembly 20 of the present disclosure upstream in the cooling loop 22 from the second component 62, the heat exchange assembly 20 removes heat from the electronic component 24 via flow of the cooling fluid through the heat exchange plate 26, and the resistive heating element 42 further heats the cooling fluid before it is provided to the second component 62 to improve heating of the second component 62. This arrangement has the advantage of eliminating the need for a separate heating module in the thermal management system 18. Instead, the resistive heating element 42 is disposed on the heat exchange plate 26, thus reducing the number of parts in the thermal management system 18, reducing cost, and improving component packaging within the vehicle.

Several embodiments have been described in the foregoing description. However, the embodiments described herein are not intended to be exhaustive or limit the invention to any particular form. The terminology which has been used is intended to be in the nature of words of description rather than of limitation. Many modifications and variations are possible in light of the above teachings and the invention may be practiced otherwise than as specifically described.

Various additional alterations and changes beyond those already mentioned herein can be made to the above-described embodiments. This disclosure is presented for illustrative purposes and should not be interpreted as an exhaustive description of all embodiments or to limit the scope of the claims to the specific elements illustrated or described in connection with these embodiments. For example, and without limitation, any individual element(s) of the described embodiments may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Any reference to claim elements in the singular, for example, using the articles "a," "an," "the" or "said," is not to be construed as limiting the element to the singular. It will be further appreciated that the terms "include," "includes," and "including" have the same meaning as the terms "comprise," "comprises," and "comprising."

What is claimed is:

1. A heat exchange assembly configured to be coupled to a cooling loop of a vehicle for cooling an electronic component of the vehicle, said heat exchange assembly comprising:

a heat exchange plate comprising:

a base plate comprising a first surface configured to be in thermal communication with the electronic component, and a second surface opposite said first surface; and a shell coupled to said second surface of said base plate, said shell comprising an inner shell surface facing said second surface of said base plate such that a cooling chamber is defined between said inner shell surface and said second surface of said base plate, and an outer shell surface opposite said inner shell surface;

wherein said shell defines a fluid inlet in fluid communication with said cooling chamber and configured to be in fluid communication with the cooling loop of the vehicle for providing a cooling fluid to said cooling chamber, and a fluid outlet in fluid communication with said cooling chamber and configured to be in fluid communication with the cooling loop of the vehicle for returning the cooling fluid to the cooling loop; and a resistive heating element disposed on said outer shell surface and in thermal communication with said cooling chamber for heating the cooling fluid within said cooling chamber to increase the temperature of the cooling fluid returned to the cooling loop via said fluid outlet;

wherein said resistive heating element comprises a conductive layer disposed on said outer shell surface and having a resistance for generating heat in response to being energized to heat the cooling fluid within the cooling chamber; and wherein said conductive layer comprises one of a thermal spray coating and a printed circuit.

2. The heat exchange assembly according to claim 1 further comprising a plurality of fins disposed in said cooling chamber to distribute flow of the cooling fluid throughout said cooling chamber.

3. The heat exchange assembly according to claim 2, wherein said cooling chamber is at least partially devoid of said plurality of fins in a region of said cooling chamber aligned with a region of said base plate where said base plate is configured to be arranged in thermal communication with the electronic component.

4. The heat exchange assembly according to claim 1, wherein said inner shell surface further defines a baffle that subdivides said cooling chamber into:

a first cooling chamber in fluid communication with said fluid inlet and configured to be in thermal communication with the electronic component, and a second cooling chamber in fluid communication with said first cooling chamber and said fluid outlet and in thermal communication with said resistive heating element.

5. The heat exchange assembly according to claim 4, wherein said heat exchange plate is configured such that the cooling fluid flows sequentially i) from the cooling loop and through said fluid inlet to said first cooling chamber to cool the electronic component, ii) from said first cooling chamber to said second cooling chamber such that said resistive heating element increases the temperature of the cooling fluid, and iii) from said second cooling chamber and through said fluid outlet to return the cooling fluid to the cooling loop.

6. The heat exchange assembly according to claim 4 further comprising a plurality of fins disposed in said second cooling chamber to distribute flow of the cooling fluid throughout said second cooling chamber.

7. The heat exchange assembly according to claim 1 further comprising a heat sink coupled to said first surface of said base plate and configured to be coupled to the electronic component such that said base plate is in thermal communication with the electronic component.

8. The heat exchange assembly according to claim 7, wherein said heat sink comprises copper.

9. The heat exchange assembly according to claim 1, wherein said base plate and said shell comprise an aluminum alloy.

10. The heat exchange assembly according to claim 9, wherein said shell is brazed to said second surface of said base plate.

11. A thermal management system comprising:

an electronic component;

the cooling loop for circulating a cooling fluid, said cooling loop comprising a first outlet port for providing a cooling fluid and a first return port for receiving the cooling fluid;

a heat exchange plate comprising:
    a base plate including a first surface arranged in thermal communication with said electronic component, and a second surface opposite said first surface; and
    a shell coupled to said second surface of said base plate, said shell including an inner shell surface facing said second surface of said base plate such that a cooling chamber is defined between said inner shell surface and said second surface of said base plate, and an outer shell surface opposite said inner shell surface;
    wherein said shell defines a fluid inlet in fluid communication with said cooling chamber and said first outlet port of said cooling loop for providing said cooling fluid to said cooling chamber, and a fluid outlet in fluid communication with said cooling chamber and said first return port of said cooling loop for returning the cooling fluid to said cooling loop; and
a resistive heating element disposed on said outer shell surface and in thermal communication with said cooling chamber for heating the cooling fluid within said cooling chamber to increase the temperature of the cooling fluid returned to said cooling loop;
    wherein said resistive heating element comprises a conductive layer disposed on said outer shell surface and having a resistance for generating heat in response to being energized to heat the cooling fluid within the cooling chamber; and
    wherein said conductive layer comprises one of a thermal spray coating and a printed circuit.

12. The thermal management system according to claim 11, wherein said cooling loop further comprises a second outlet port downstream from said first return port, said second outlet port in thermal communication with a second component to heat said second component.

13. The thermal management system according to claim 12, wherein said second component is one of a vehicle battery and a vehicle cabin heat exchanger.

14. The thermal management system according to claim 11, wherein said inner shell surface further defines a baffle that subdivides said cooling chamber into:
    a first cooling chamber in fluid communication with said fluid inlet and in thermal communication with said electronic component, and
    a second cooling chamber in fluid communication with said first cooling chamber and said fluid outlet and in thermal communication with said resistive heating element.

15. The thermal management system according to claim 14, wherein said heat exchange plate is configured such that the cooling fluid flows sequentially i) from said first outlet port of said cooling loop and through said fluid inlet to said first cooling chamber to cool said electronic component, ii) from said first cooling chamber to said second cooling chamber such that said resistive heating element increases the temperature of the cooling fluid, and iii) from said second cooling chamber and through said fluid outlet and to said first return port of said cooling loop to return the cooling fluid to said cooling loop.

16. The thermal management system according to claim 15, wherein said cooling loop further comprises a second outlet port downstream from said first return port, said second outlet port in thermal communication with a second component to heat said second component.

17. The thermal management system according to claim 16, wherein said heat exchange plate is further configured such that the cooling fluid flows further sequentially iv) to said second outlet port of said cooling loop to heat said second component.

18. The thermal management system according to claim 11 further comprising a heat sink interposed between said first surface of said base plate and said electronic component to arrange said base plate in thermal communication with said electronic component.

19. A thermal management system comprising:

an electronic component;

a cooling loop for circulating a cooling fluid, said cooling loop comprising a first outlet port for providing a cooling fluid and a first return port for receiving the cooling fluid;

a heat exchange plate comprising:
    a base plate including a first surface arranged in thermal communication with said electronic component, and a second surface opposite said first surface; and
    a shell coupled to said second surface of said base plate, said shell including an inner shell surface facing said second surface of said base plate such that a cooling chamber is defined between said inner shell surface and said second surface of said base plate, and an outer shell surface opposite said inner shell surface;
    wherein said shell defines a fluid inlet in fluid communication with said cooling chamber and said first outlet port of said cooling loop for providing said cooling fluid to said cooling chamber, and a fluid outlet in fluid communication with said cooling chamber and said first return port of said cooling loop for returning the cooling fluid to said cooling loop; and a resistive heating element disposed on said outer shell surface and in thermal communication with said cooling chamber for heating the cooling fluid within said cooling chamber to increase the temperature of the cooling fluid returned to said cooling loop;

wherein said cooling loop further comprises a second outlet port downstream from said first return port, said second outlet port in thermal communication with a second component to heat said second component.

20. The thermal management system according to claim 19, wherein said second component is one of a vehicle battery and a vehicle cabin heat exchanger.

* * * * *